United States Patent
Hasegawa (10) Patent No.: US 7,821,092 B2
(45) Date of Patent: Oct. 26, 2010

(54) SEMICONDUCTOR DEVICE

(75) Inventor: Akihiro Hasegawa, Hashima (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 210 days.

(21) Appl. No.: 12/076,510

(22) Filed: Mar. 19, 2008

(65) Prior Publication Data
US 2008/0237759 A1    Oct. 2, 2008

(30) Foreign Application Priority Data
Mar. 28, 2007    (JP)    ............... 2007-084640

(51) Int. Cl.
*H01L 31/00*    (2006.01)
(52) U.S. Cl. .............. 257/459; 257/466; 257/774; 257/E29.013; 257/E23.002; 257/E27.13
(58) Field of Classification Search ........... 257/459, 257/466, 774, E27.13, E29.013, E23.002
See application file for complete search history.

(56) References Cited

U.S. PATENT DOCUMENTS

| | | | |
|---|---|---|---|
| 6,376,871 B1 | 4/2002 | Arai | |
| 6,412,786 B1* | 7/2002 | Pan | 277/630 |
| 2006/0113622 A1* | 6/2006 | Adkisson et al. | 257/443 |
| 2007/0072326 A1* | 3/2007 | Zheng et al. | 438/48 |
| 2007/0194396 A1* | 8/2007 | Nomura | 257/431 |

FOREIGN PATENT DOCUMENTS

| | | |
|---|---|---|
| JP | A-10-050966 | 2/1998 |
| JP | A-2001-060713 | 3/2001 |

* cited by examiner

*Primary Examiner*—Tu-Tu V Ho
(74) *Attorney, Agent, or Firm*—Oliff & Berridge, PLC (57) ABSTRACT

An open portion is provided to an interlayer insulation film so as to correspond to a photoreceptor part of an optical detection device. A partition wall for surrounding the open portion (120) is formed by a metal material inside a wiring structure layer (90) along the boundary between the photoreceptor part (4) and a circuit part (6). The partition wall is formed by a contact structure having a multi-level structure with respect to a separation region (74) disposed on the external periphery of the photoreceptor part (4). The partition wall prevents moisture absorption and light penetration from the wall surface of the open portion, and suppresses wiring degradation or fluctuation of the characteristics of the circuit elements on the periphery of the photoreceptor part.

4 Claims, 9 Drawing Sheets

FIG. 1

(related art)

FIG.2

(prior art)

SEMICONDUCTOR DEVICE

CROSS-REFERENCE TO RELATED APPLICATION

The priority application number JP2007-084640 upon which this patent application is based is hereby incorporated by reference.

BACKGROUND OF THE INVENTION

1. Field of the Invention

The present invention relates to a semiconductor device having a photoreceptor part that has an open part formed on a wiring structure layer layered on a semiconductor substrate, and a circuit part disposed adjacent to the photoreceptor part on the semiconductor substrate.

2. Description of the Related Art

Optical disks such as CD (Compact Disc) and DVD (Digital Versatile Disk) have recently come to account for a significant portion of information storage media. Through the use of an optical pickup mechanism in playback devices for these optical disks, a laser light is radiated along a track of the optical disk, and the reflected light is detected. The recorded data are retrieved based on variation of the reflected light intensity.

Since the data rate of reading from the optical disk is extremely high, the optical detector for detecting the reflected light is composed of a semiconductor element that uses a PIN photodiode having a high response speed. The faint photoelectric conversion signal generated in the photoreceptor part of the semiconductor element is amplified by an amplifier and outputted to a signal processing circuit of a subsequent stage. From the perspective of maintaining the frequency characteristics of the photoelectric conversion signal, and restricting the superposition of noise, the wiring length between the photoreceptor part and the amplifier is made as short as possible. From this perspective, and from the perspective of reducing the manufacturing cost of the optical detection device, the photoreceptor part, as well as the circuit part that includes the amplifier and other components, are preferably formed on the same semiconductor chip. Such an optical detection device is disclosed in Japanese Laid-open Patent Application No. 2001-60713.

Figure 1:
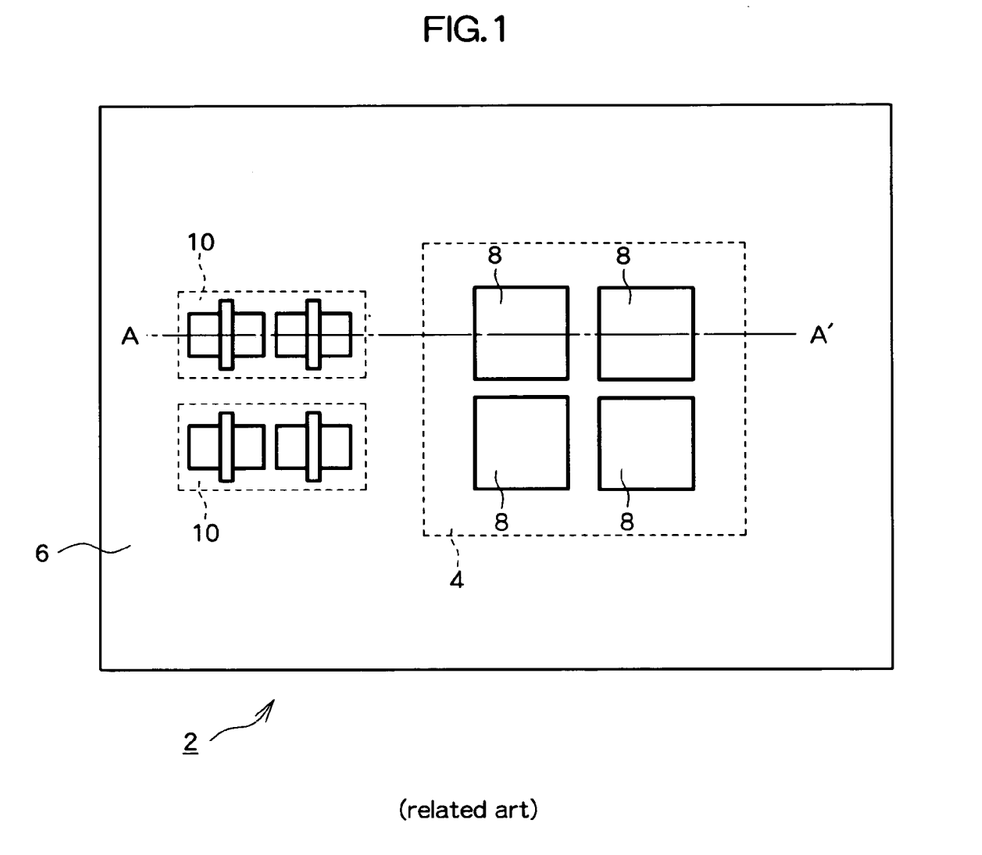
FIG. 1 is a schematic plan view showing an optical detection device in which a photoreceptor part and a circuit part are disposed adjacent to each other on the same semiconductor substrate.

FIG. 1 is a schematic plan view showing an optical detection device in which a photoreceptor part and a circuit part are disposed adjacent to each other on the same semiconductor substrate. The optical detection device 2 is formed on a semiconductor substrate composed of silicon. The optical detection device 2 has a photoreceptor part 4 and a circuit part 6. The photoreceptor part 4 includes four PIN photodiodes (PD) 8 arranged 2×2, for example. Light that is incident on the substrate surface from an optical system is divided into four segments and received. The circuit part 6 is disposed on the periphery of the photoreceptor part 4, for example. A CMOS 10 and other circuit elements, for example, are formed in the circuit part 6. An amplification circuit for the output signal from the photoreceptor part 4, as well as other signal processing circuits can be formed on the same semiconductor chip as the photoreceptor part 4 by using the circuit elements in the circuit part 6. Although not shown in FIG. 1, wiring connected to the circuit elements, as well as wiring connected to a diffusion layer that constitutes the photoreceptor part 4, are provided in the circuit part 6. These units of wiring are formed by patterning an Al layer that is layered on the semiconductor substrate.

Figure 2:
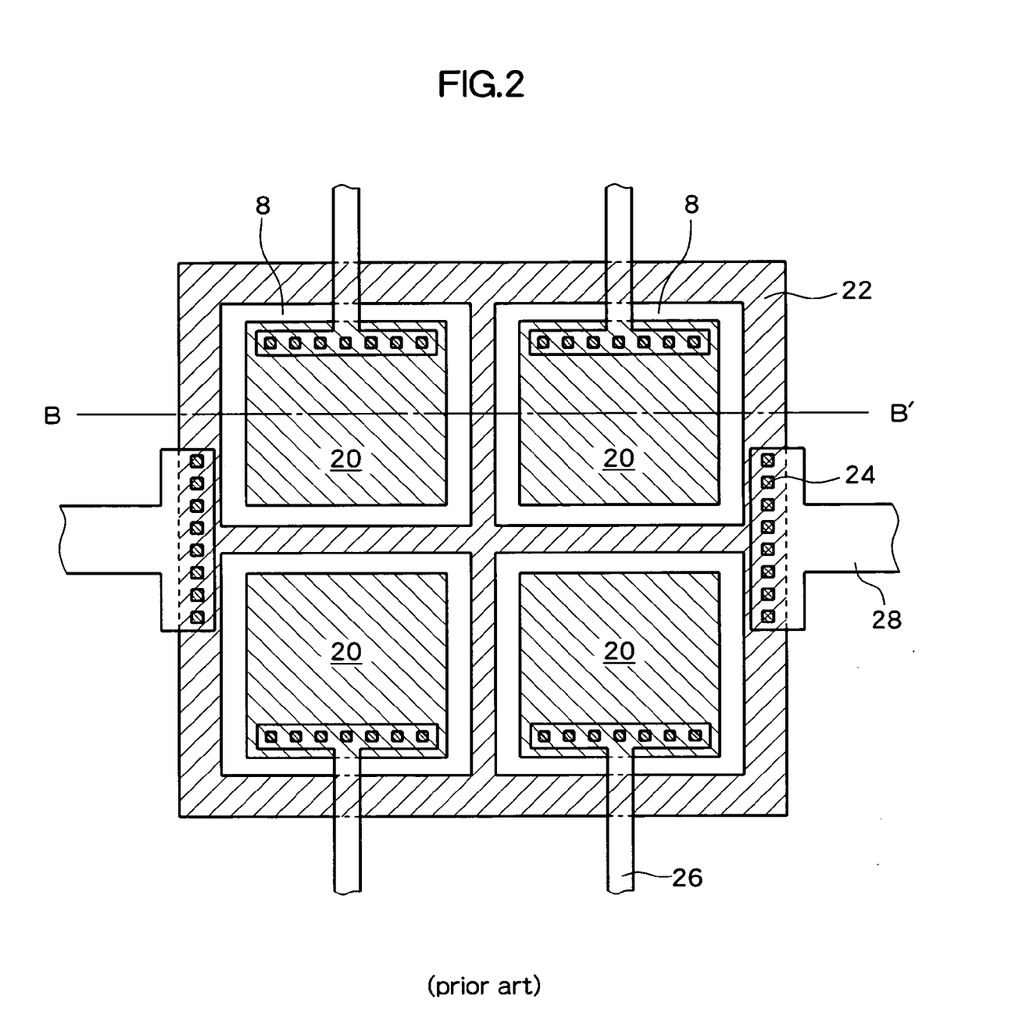
FIG. 2 is a plan view showing the photoreceptor part in the conventional optical detection device.

FIG. 2 is a more detailed plan view showing the conventional photoreceptor part 4. In the silicon substrate in the photoreceptor part 4, electrons and holes are generated by the absorption of light, and the generated electrons are gathered as signal charges in a cathode of each reverse-bias PD 8. For example, An $n^+$ region in which an n-type impurity is diffused at a high concentration is formed in the semiconductor substrate surface of each of the PDs 8 as a cathode region 20 of the PDs 8. For the anode region, for example, a separation region 22 composed of a $p^+$ region in which a p-type impurity is diffused at a high concentration is formed in the peripheral semiconductor substrate surface of each cathode region 20.

The cathode regions 20 and the separation regions 22 are each connected via contact holes 24 formed in an insulation film on the semiconductor substrate surface by wiring formed, for example, by an aluminum (Al) layer or the like layered on the insulation film. The signal charges collected by each cathode region 20 are each read via wiring 26. The separation regions 22 is applied, for example, a ground potential by wiring 28.

Figure 3:
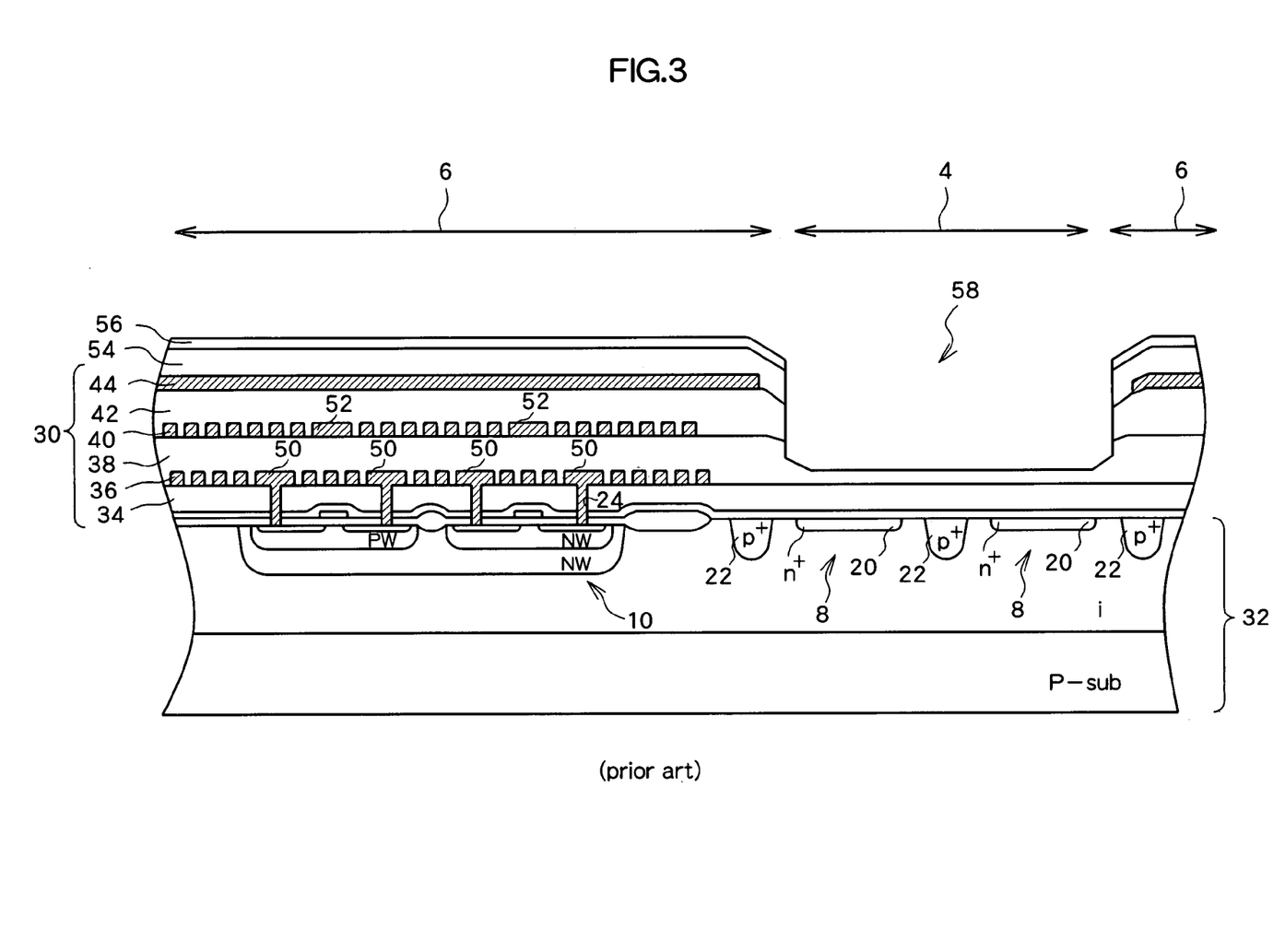
FIG. 3 is a schematic sectional view showing the structure of the photoreceptor part and circuit part of the conventional optical detection device.

FIG. 3 is a schematic sectional view showing the structure of the photoreceptor part 4 and the circuit part 6 in a cross section perpendicular to the semiconductor substrate along line A-A' in FIG. 1. The line B-B' shown in FIG. 2 corresponds to the line A-A' in the photoreceptor part 4 shown in FIG. 1. This cross-section shows the structures of two of the PDs 8 of the photoreceptor part 4, and the CMOS 10 of the circuit part 6. A wiring structure layer 30, a protective film, or the like is formed on the semiconductor substrate on which the PDs 8, the CMOS 10, and other circuit elements are formed. The wiring structure layer 30 has a structure in which a plurality of Al layers for forming the wiring 26, 28 and the like, as well as a plurality of interlayer insulation films for insulating the Al layers from each other, are layered in alternating fashion. For example, in the wiring structure layer 30, a first interlayer insulation film 34, a first Al layer 36, a second interlayer insulation film 38, a second Al layer 40, a third interlayer insulation film 42, and a third Al layer 44 are layered in sequence on the semiconductor substrate 32. For example, the first Al layer 36 and the second Al layer 40 are patterned, and wiring 50, 52 and other wirings are formed in the circuit part 6. The third Al layer 44 constitutes a light-shielding film for shielding light to the circuit part 6. A TEOS (Tetra-EthOxy-Silane) film 54 and a silicon nitride film (SiN film) 56 are layered in sequence on the wiring structure layer 30.

The wiring 50 formed by the first Al layer 36 can be connected to the cathode region 20, the separation region 22, the source and drain of the CMOS 10, and other components via the contact holes 24 formed in the first interlayer insulation film 34 and other films under the wiring 50. The wiring 52 formed by the second Al layer 40 is connected to the underlying wiring 50 as needed via contact holes that are formed in the underlying second interlayer insulation film 38 and the like.

The wiring structure layer 30 and the overlying layers in the region that corresponds to the photoreceptor part 4 are etched back to increase the efficiency of light incidence on the PDs 8, and an open portion 58 is formed in the position of the photoreceptor part 4. Reducing the thickness of the wiring structure layer 30 in the photoreceptor part 4 by etching in this manner enhances the transmittance of light to the silicon substrate 32, and it is expected that the photoelectric conversion signal by reflected laser light will be obtained with a good intensity.

The interlayer insulation films are formed using materials such as SOG (Spin On Glass), BPSG (BoroPhosphoSilicate Glass), and TEOS (Tetra-EthOxy-Silane). These materials have moisture absorbing properties but are disadvantageous in that the absorbed moisture causes deterioration of the Al wiring and fluctuation of the element characteristics of the circuit part 6. In this regard, a silicon nitride film absorbs relatively little moisture, and the silicon nitride film 56 that is deposited over the interlayer insulation films on the circuit part 6 in the conventional technique functions as a moisture barrier film for the underlying interlayer insulation film.

However, in the conventional configuration, the interlayer insulation films are exposed on the inside of the open portion 58, and moisture can be absorbed from this exposure. Particularly since the side walls of the open portion 58 are adjacent to the circuit part 6, absorbed moisture from this portion easily causes the abovementioned wiring deterioration or fluctuation in the circuit element characteristics.

The reflected laser light or other light that is directed at the photoreceptor part 4 and is incident on the open portion 58 is suitably blocked by the light-shielding layer formed by the Al layer on the device surface, but the light can penetrate into the interlayer insulation film from the side walls of the open portion 56. The penetrated light can proceed into the inside of the circuit part 6 through multiple reflections at the Al layer, interfaces of layers having different refractive indices, and the like. Drawbacks occur in that such penetrated light enters transistors and other elements of the circuit part 6 and affects the operation thereof, and can generate noise in the electrical signals of the circuit part 6.

SUMMARY OF THE INVENTION

The present invention was developed in order to overcome the abovementioned drawbacks, and an object of the present invention is to provide a semiconductor device in which fluctuations in characteristics, as well as wiring deterioration or noise generation, are suppressed in a circuit part that is disposed adjacent to a photoreceptor part.

In the semiconductor device according to the present invention, a photoreceptor part and a circuit part are arranged adjacent to each other on a shared semiconductor substrate, and the semiconductor device comprises a wiring structure layer that is layered over the semiconductor substrate, and that includes an interlayer insulation film; an open portion of the wiring structure layer, formed in a position of the photoreceptor part; and a partition wall composed of a metal material that is formed within the wiring structure layer adjacent to the open portion, along a boundary of the photoreceptor portion with the circuit portion.

DESCRIPTION OF THE PREFERRED EMBODIMENTS

Embodiments of the present invention will be described hereinafter based on the drawings. The present embodiment is an optical detection device mounted in the optical pickup mechanism of a playback device of an optical disk such as a CD or DVD.

The general planar structure of the semiconductor device of the optical detection device of the present embodiment is the same as the plan view of FIG. 1 and the structure described using FIG. 1. In the description given hereinafter, the same reference symbols are used to refer to constituent elements that are the same as those already described with reference to FIG. 1, and no further description thereof will be given.

Figure 4:
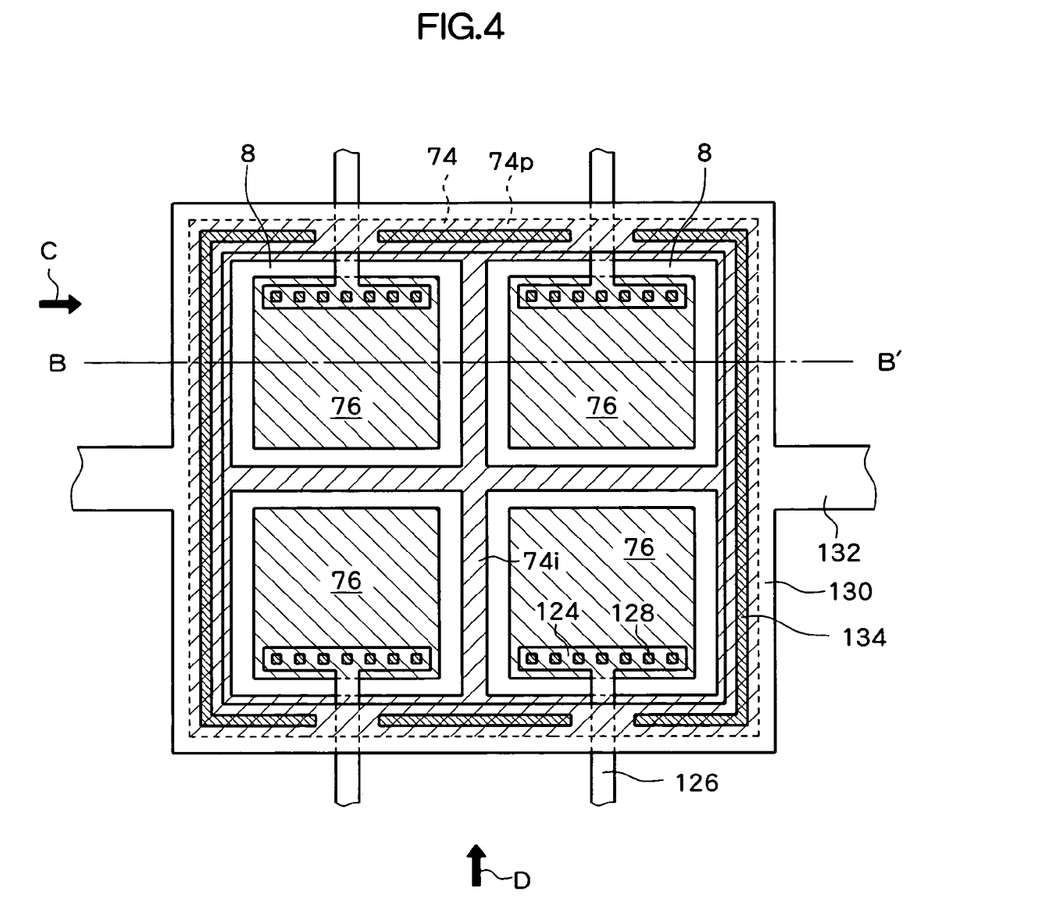
FIG. 4 is a plan view showing the photoreceptor part of the optical detection device according to an embodiment of the present invention.
Figure 5:
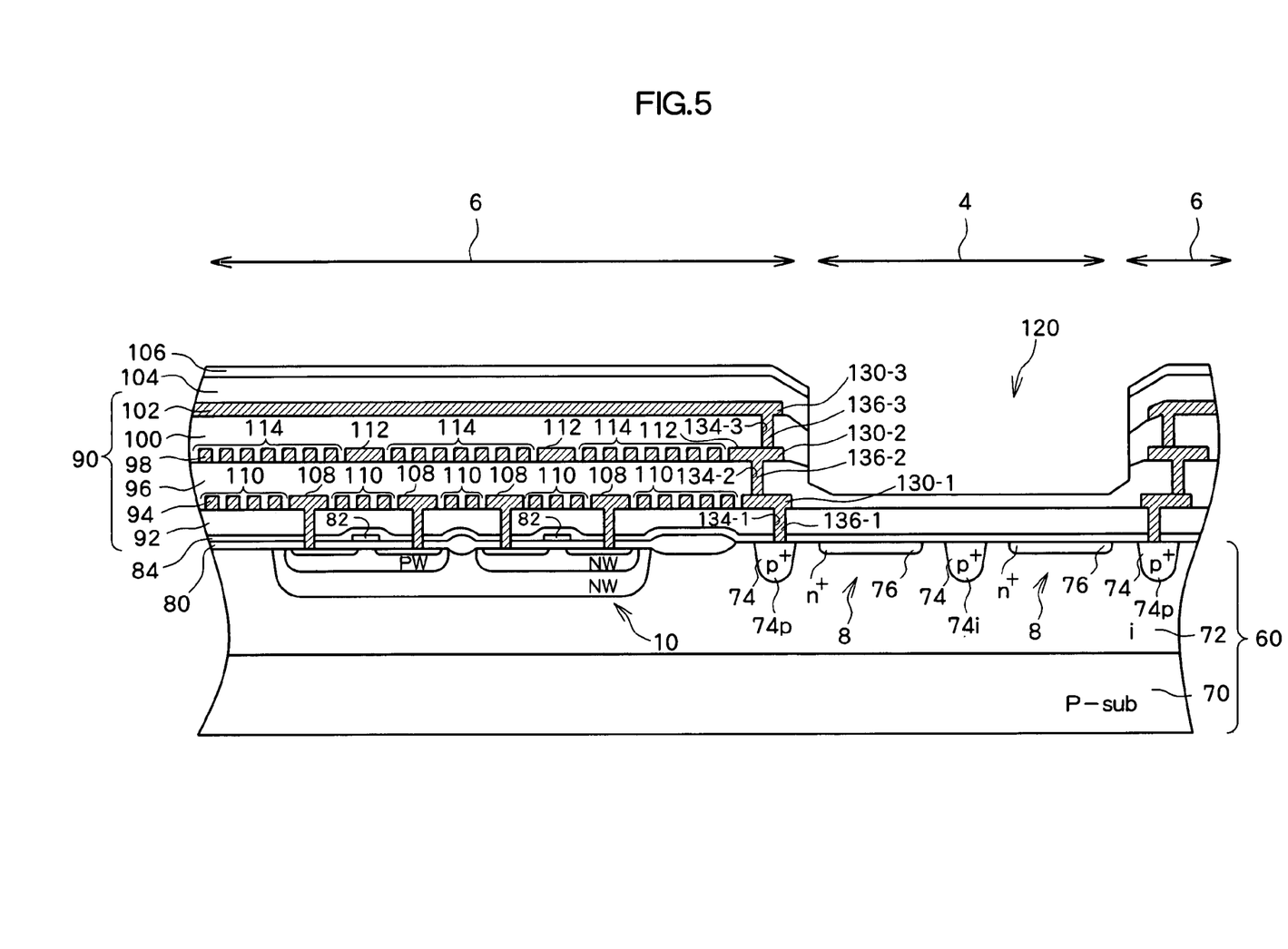
FIG. 5 is a schematic sectional view showing the structure of the photoreceptor part and circuit part of the optical detection device according to an embodiment of the present invention.

FIG. 4 is a more detailed plan view of the photoreceptor part 4 in the optical detection device 2 of the present embodiment. FIG. 5 is a schematic sectional view showing the structure of the photoreceptor part 4 and circuit part 6 in a cross section perpendicular to the semiconductor substrate along line A-A' in FIG. 1. This sectional view shows the structures of two of the PDs 8 of the photoreceptor part 4; the CMOS 10 of the circuit part 6; the wiring or interlayer insulation films layered over the semiconductor substrate 60 on which the photoreceptor part 4 and the circuit part 6 are formed; and other components. The line B-B' shown in FIG. 4 corresponds to the line A-A' in the photoreceptor part 4 in FIG. 1. Specifically, the structures in the photoreceptor part 4 in FIG. 5 indicate the sectional structure along line B-B' in FIG. 4.

The optical detection device 2 is created using a semiconductor substrate 60 in which an epitaxial layer 72 having a higher specific resistance and a lower impurity concentration than a P-sub layer 70 is deposited on a P-sub layer 70, which is a p-type silicon substrate into which a p-type impurity is implanted. The P-sub layer 70 forms an anode common to the PDs 8, e.g., a ground potential is applied from the back surface of the substrate. The separation regions 74 form an anode together with the P-sub layer 70, and the ground potential is applied by wiring provided to the back surface of the substrate.

In the photoreceptor part 4, the epitaxial layer 72 constitutes an i layer of the PDs 8. In the photoreceptor part 4, the abovementioned separation regions 74 and cathode regions 76 are formed in the surface of the epitaxial layer 72.

A silicon oxide film 80 for forming a gate oxide film or local oxide film (LOCOS) is formed on the surface of the semiconductor substrate 60. Gate electrodes 82 for MOSFET for comprising the CMOS 10, or the like are formed using, for example, polysilicon, tungsten (W) on the gate oxide film. A silicon oxide film 84 is furthermore formed on the substrate surface so as to cover the gate electrodes.

A wiring structure, protective film, or other structure is formed over the semiconductor substrate on which the PDs 8, the structures of the CMOS 10, and other circuit elements are formed. In the wiring structure layer 90, a plurality of Al layers and a plurality of interlayer insulation films for insulating the Al layers from each other are layered in alternating fashion. For example, in the wiring structure layer 90, a first interlayer insulation film 92, a first Al layer 94, a second interlayer insulation film 96, a second Al layer 98, a third interlayer insulation film 100, and a third Al layer 102 are layered in sequence. A TEOS film 104 and a silicon nitride film 106 are layered in sequence on the wiring structure layer 90.

The Al layers are each patterned using a photolithography technique. For example, wiring 108 and planarizing pads 110 are formed in the circuit part 6 by the first Al layer 94, and wiring 112 and planarizing pads 114 are formed in the circuit part 6 by the second Al layer 98. The third Al layer 102 is provided on the circuit part 6, and forms a light shielding film for preventing light from entering the circuit part 6 from the device upper surface.

The planarizing pads 110, 114 are provided in the gaps of the wiring 108 and the gaps of the wiring 112, respectively, and suppress irregularities in the surfaces of the interlayer insulation films 96, 100 layered on the first Al layer 94 and the second Al layer 98, respectively. The interlayer insulation films are formed using materials such as SOG, BPSG, and TEOS.

The silicon nitride film 106 constitutes a protective film for the device upper surface. The silicon nitride film 106 is moisture resistant, and suppresses the penetration of moisture into the wiring structure layer 90 from the device upper surface.

In order to increase the efficiency of light incidence on the PDs 8, the region corresponding to the photoreceptor part 4 is etched back in the wiring structure layer 90. An open portion 120 is thereby formed in the region corresponding to the photoreceptor part 4. A part of the thickness of the interlayer insulation films constituting the wiring structure layer 90 is allowed to remain as a protective layer 122 for the surface of the semiconductor substrate 60 of the photoreceptor part 4 in the bottom portion of the open portion 120. Etching the wiring structure layer 90 in the photoreceptor part 4 in this manner and providing the open portion 120 enhances the transmittance of light to the PDs 8, and makes it possible to obtain the photoelectric conversion signal by reflected laser light with high amplitude.

As shown in FIG. 4, the cathode regions 76 are disposed in four PDs 8 that are arranged 2×2. The separation regions 74 are composed of an inside portion 74i that is provided between the cathode regions 76 for separating the PDs 8 from each other, and an external peripheral portion 74p that is arranged so as to completely surround the four PDs 8 and functions to separate the photoreceptor part 4 and the circuit part 6 from each other.

Electrodes 124 formed, for example, by the first Al layer 94 and kept in contact with the cathode regions 76 are formed on the cathode regions 76. The electrodes 124 are also connected to wiring 126 that extends to the circuit part 6. Specifically, contact holes 128 are formed in the insulation films sandwiched by the cathode regions 76 and the electrodes 124, and after the contact holes 128 are formed, the Al layer for forming the electrodes 124 is deposited. The Al layer is deposited in the contact holes 128 as well, whereby the electrodes 124 are electrically connected to the cathode regions 76. The signal charges collected in the cathode regions 76 are each read to the circuit part 6 via the electrodes 124 and the wiring 126.

The wiring structure for the separation regions 74 has an electrode 130 disposed along the external peripheral portion 74p of the separation regions 74, and also has wiring 132 for supplying the ground potential from the circuit part 6 to the electrode 130. An electrode 130 is formed in each of the Al layers 94, 98, 102. The electrode 130-3 of the third Al layer 102 can be formed integrally with a portion provided as the light shielding film on the circuit part 6 of the third Al layer 102. The electrode 130 and the trench 134 shown in FIG. 4 correspond to the electrode 130-2 of the second Al layer 98 and to the trench 134-2 of the second interlayer insulation film 96 under the electrode 130-2, respectively. The wiring 132 can be formed by the first Al layer 94 or the second Al layer 98, for example. Since the wiring 132 supplies a direct-current potential, a light-shielding film composed of the third Al layer 102 and formed integrally with the electrode 130-3 may be used as the wiring 132.

The trenches 134-1 through 134-3 are formed along the external periphery of the photoreceptor part 4 in the insulation films under the electrodes 130-1 through 130-3 (the interlayer insulation films 92, 96, 100 and the silicon oxide film 84 under the wiring structure layer) before the electrodes 130-1 through 130-3 are formed. The Al layer deposited on the trenches 134-1 through 134-3 forms plugs 136-1 through 136-3 for filling in the trenches 134. Through these plugs, the electrode 130-1 of the first Al layer 94 contacts the separation regions 74, and the electrodes 130-2, 130-3 of the Al layers 98, 102 contact the lower-layer electrodes 130-1, 130-2, respectively.

Specifically, as shown in FIG. 5, the plugs 136-1 through 136-3 and the electrodes 130-1 through 130-3 are stacked on the external peripheral portions 74p of the separation regions 74; and a contact structure is formed for providing a vertical connection from the surface of the semiconductor substrate 60 to the topmost third Al layer 102 of the wiring structure layer 90. The vertically stacked contact structure is formed continuously along the external peripheral portions 74p of the separation regions 74, and forms a wall along the external periphery of the photoreceptor part 4. The wall formed by an Al layer inside the wiring structure layer 90 adjacent to the open portion 120 is a partition wall for partitioning the photoreceptor part 4 and the circuit part 6, and moisture or light is prevented from penetrating into the circuit part 6 from the open portion 120.

The plugs 136 may be formed in a different step than the depositing of the Al layers 94, 98, 102. For example, the plugs 136 may be formed by a damascene process using tungsten or the like. In this case, after the plugs 136 composed of tungsten or the like are embedded in the trenches 134 by a damascene process or the like, the electrodes 130 composed of Al layers are formed in contact with the upper surfaces of the plugs 136.

Figure 6:
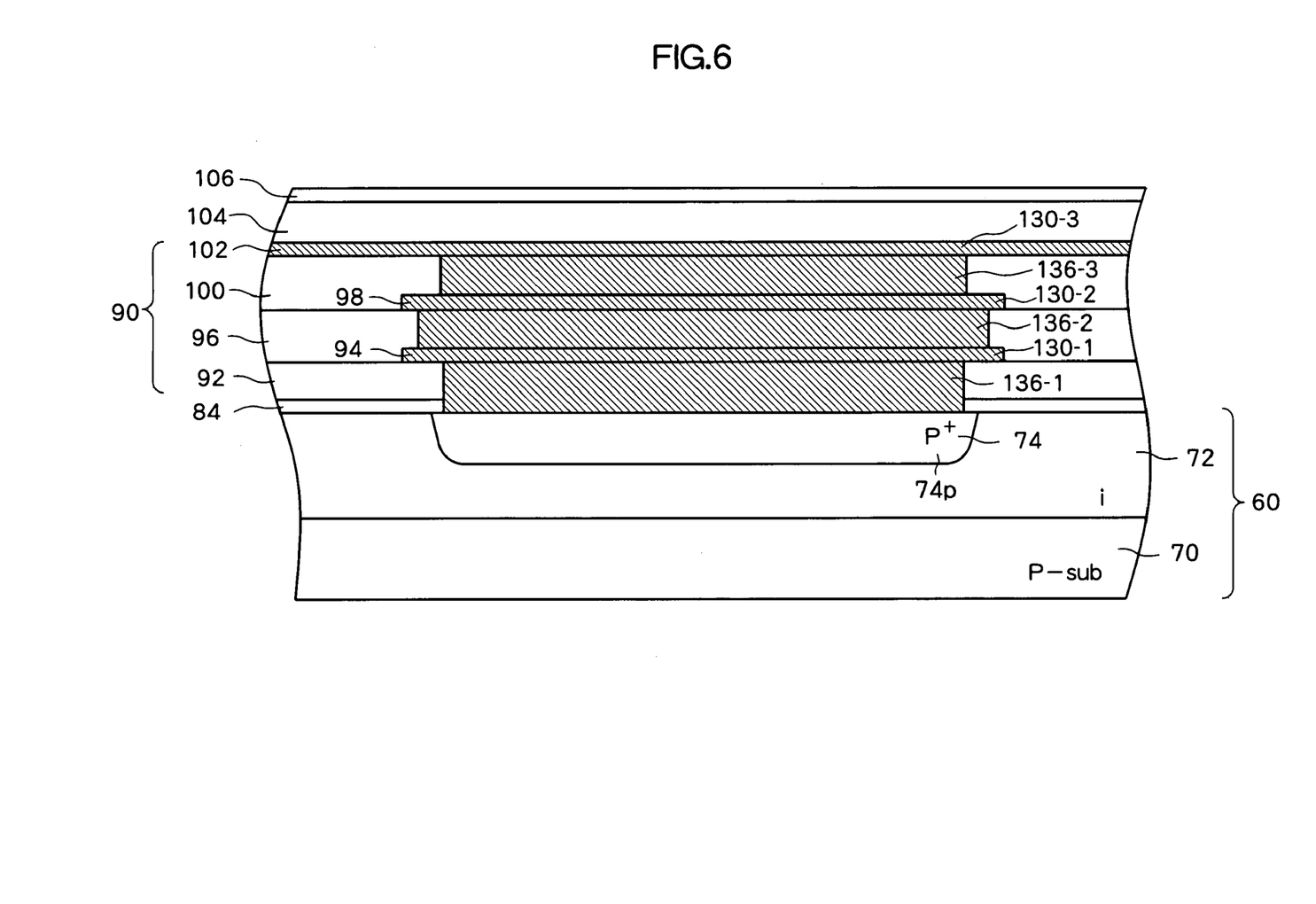
FIG. 6 is a schematic front view of the partition wall that shows the basic structure of the partition wall.
Figure 7:
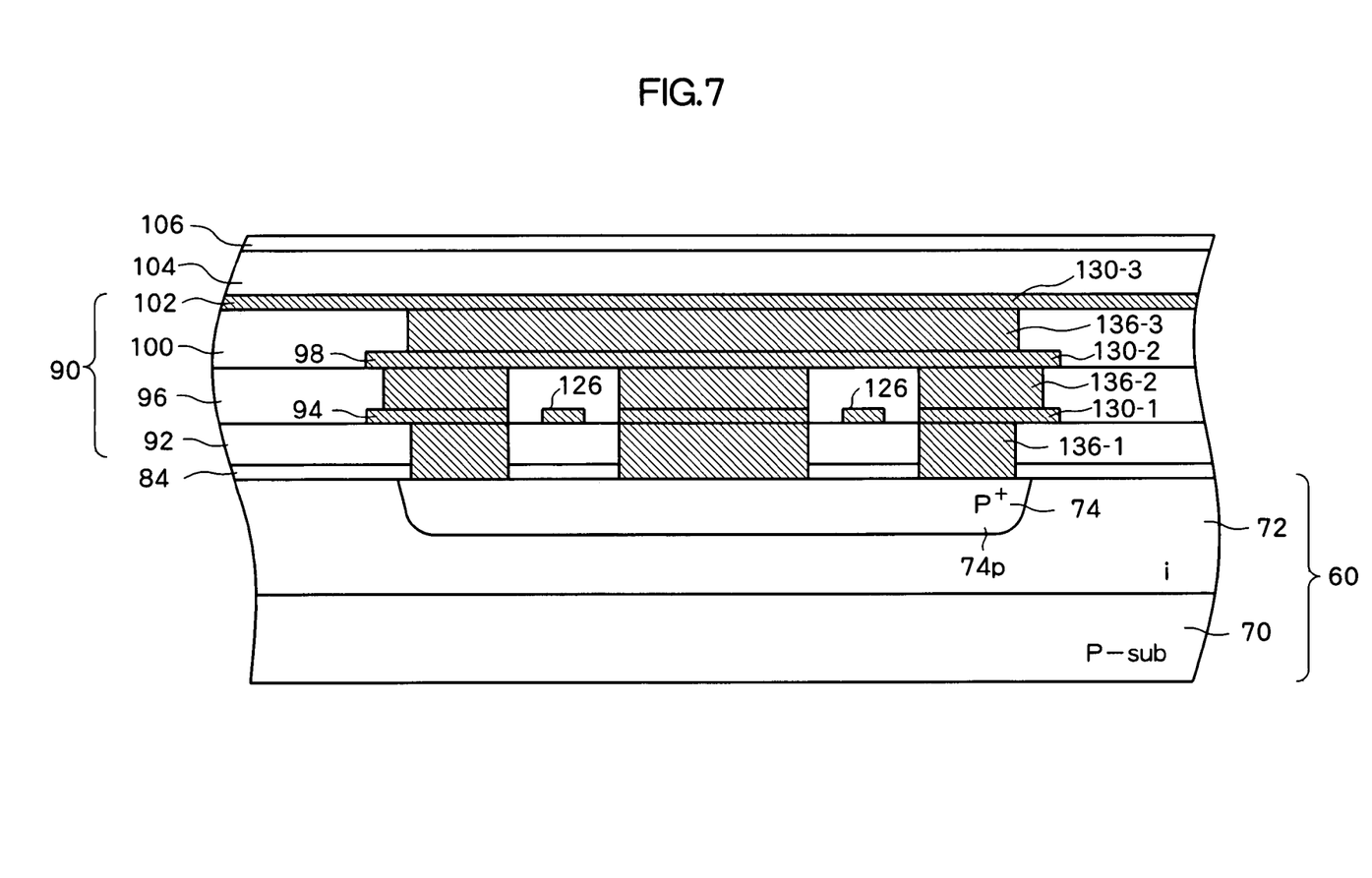
FIG. 7 is a schematic front view of the partition wall that shows the structure of the partition wall in a side surface that has holes.

FIGS. 6 and 7 are schematic views showing the structure of the partition wall as viewed from the direction of the arrows C and D shown in FIG. 4, respectively. The arrow C is orthogonal to the edge to which the wiring 126 from the cathode regions 76 does not extend among the edges of the rectangular external peripheral portions 74p. The arrow D is orthogonal to the edge to which the wiring 126 from the cathode regions 76 extends among the edges of the external peripheral portions 74p. As shown in FIG. 6, in the edge of the external peripheral portion 74p to which the wiring 126 does not extend, the trenches 134 are formed continuously from one end of the edge to the other end thereof. The plugs 136 embedded therein, as well as the electrodes 130 on the plugs 136, may also be formed continuously over the entire edge. A partition wall is thereby formed in which the plug 136-1, the electrode 130-1, the plug 136-2, the electrode 130-2, the plug 136-3, and the electrode 130-3 are stacked in sequence on the entire edge of the separation region 74.

As shown in FIG. 7, the partition wall formed at the edge of the external peripheral region 74p to which the wiring 126 extends also forms a continuous wall substantially along the edge, but holes through which the wiring 126 passes are formed in a portion thereof. For example, when the wiring 126 is formed by the first Al layer 94, the trench 134-2 of the second interlayer insulation film 96, as well as the trench 134-1 of the silicon oxide film 84 and the first interlayer insulation film 92, are not formed in the positions at which the external peripheral portion 74p and the wiring 126 intersect, and the plugs 136-1 and 136-2 are also correspondingly not formed above and below the wiring 126. In the third interlayer insulation film 100, the plug 136-3 can also be formed continuously over the wiring 126, and the plug 136-3 is formed continuously on the entire periphery of the open portion 120.

As described above using FIGS. 6 and 7, the partition wall has holes through which the wiring 126 passes, but the partition wall is formed so as to substantially continuously surround the entire periphery of the open portion 120 and to suitably partition the photoreceptor part 4 and the circuit part 6 from each other.

Figure 8:
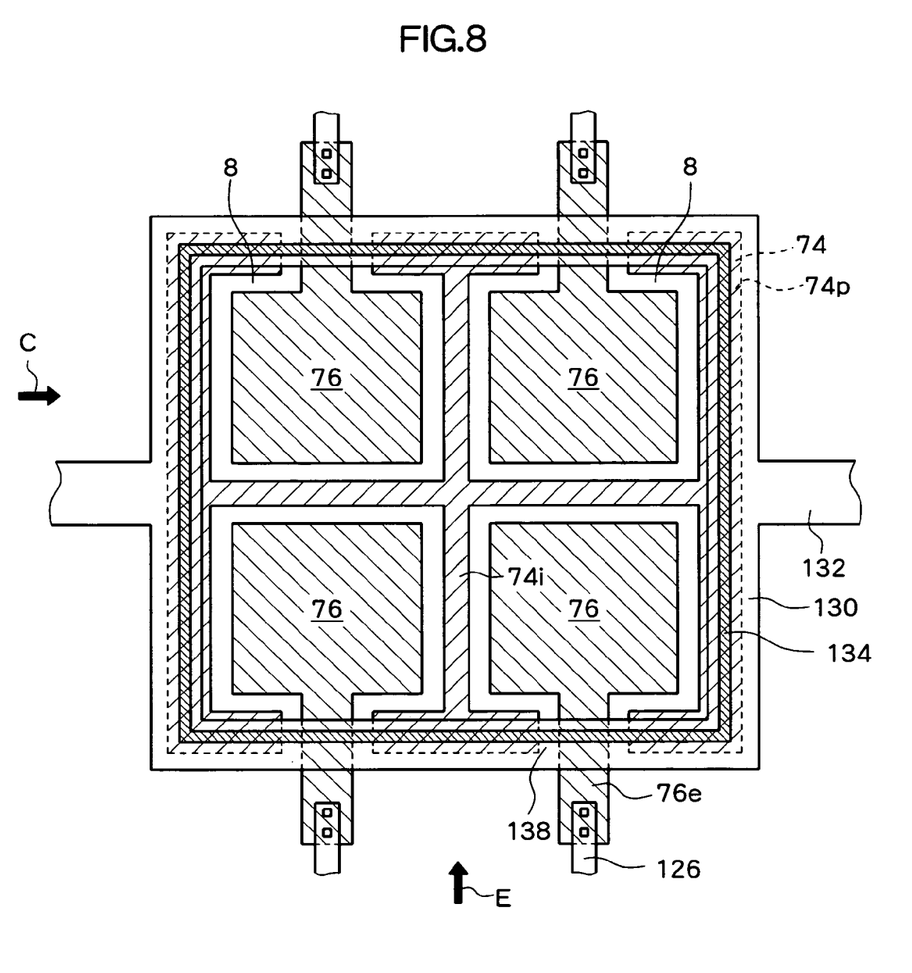
FIG. 8 is a schematic plan view showing a photoreceptor part in which the holes in the partition wall can be reduced in size.

A configuration is described in the embodiment in which a hole is provided in the partition wall in order for the wiring 126 to lead to the circuit part. This hole can also be reduced in size by designing a structure for bringing out a signal from the cathode regions 76. FIG. 8 is a schematic plan view showing the photoreceptor part 4 in which the size of the hole in the partition wall can be reduced. The configuration shown in FIG. 8 differs from the configuration shown in FIG. 4 in that the cathode regions 76 extend to the outside from cut portions 138 of the separation regions 74 that are provided to the external peripheral portions 74p of the cathode regions 76. In this configuration, the wiring 126 contacts the extended portions 76e that extend further to the outside than the external peripheral portions 74p of the cathode regions 76, whereby the wiring 126 need not pass through the partition wall.

Figure 9:
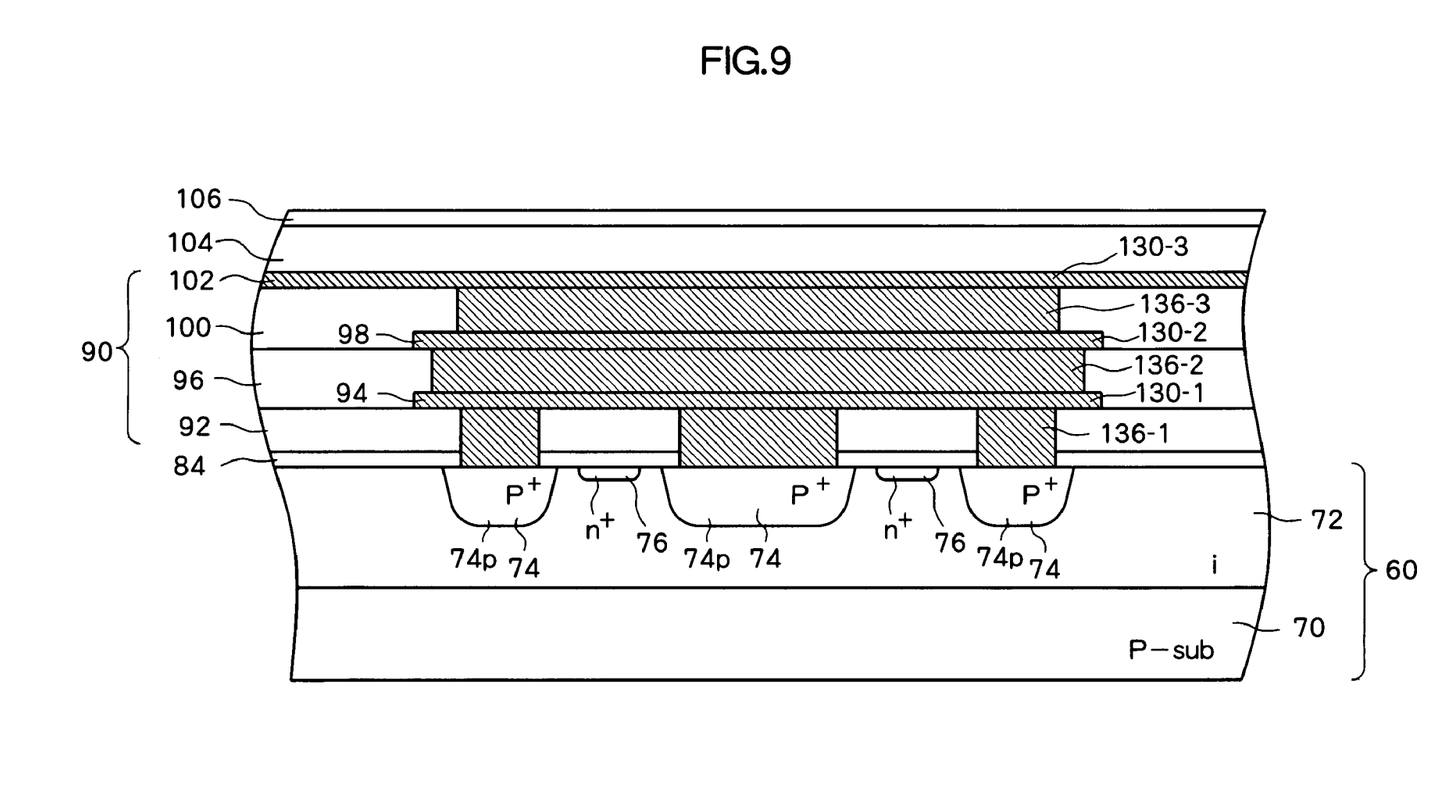
FIG. 9 is a schematic front view of the partition wall that shows the structure of the partition wall of the photoreceptor part shown in FIG. 8.

FIG. 9 is a schematic diagram showing the structure of the partition wall as viewed from the direction of the arrow E in FIG. 8. The arrow E is orthogonal to the edge on which the extended portions 76e of the cathode regions 76 are provided among the edges of the rectangular external peripheral portions 74p. In this configuration, since not only the plug 136-3 of the third interlayer insulation film 100, but also the plug 136-2 of the second interlayer insulation film 96 is formed continuously along the entire edge, the holes in the partition wall can be further reduced in size with respect to the configuration shown in FIG. 7. The structure of the partition wall as viewed from the arrow C in FIG. 8 is the same as the structure described using FIG. 6.

In the configuration shown in FIG. 8, a process can be designed so that the first interlayer insulation film 92 and the silicon oxide film 84 can be etched selectively. Through this configuration, a trench can be formed on the entire edge shown in FIG. 9 in the first interlayer insulation film 92, and the trench can be configured so as to pass through the silicon oxide film 84 only above the external peripheral portions 74p of the separation regions 74 and reach the surface of the semiconductor substrate 60. In this case, the plug 136-1 of the first interlayer insulation film 92 is embedded all the way up to the top of the silicon oxide film 84 in the portions in which the cathode regions 76 extend to the outside, and the holes in the partition wall can be further reduced in size.

An example was described in the embodiment in which a partition wall for surrounding the open portion 120 is formed in a configuration in which the wiring structure layer 90 includes three Al layers, but there may be one or any number of levels of plugs 136 that are stacked as the partition wall.

When the circuit part 6 is disposed only in a specific direction with respect to the photoreceptor part 4, the effect of a hole in the partition wall on the blocking of moisture and light to the circuit part 6 can be reduced in a configuration in which the wiring 126 and other wiring extends in directions in which the circuit part 6 is not provided. In the case in which the circuit part 6 is disposed only in a specific direction with respect to the photoreceptor part 4, it is also possible to optionally adopt a simple configuration in which the partition wall is omitted in directions other than the specific direction.

According to the present invention, a partition wall composed of a metal material formed along the boundary between a photoreceptor part and a circuit part within a wiring structure layer adjacent to an open portion prevents the penetration of moisture or light into the circuit part from the side walls of the open portion. Fluctuation of the characteristics of the circuit part, as well as wiring degradation or noise generation, are therefore suppressed.

What is claimed is:

1. A semiconductor device in which a photoreceptor part and a circuit part are arranged adjacent to each other on a shared semiconductor substrate, the semiconductor device comprising:
   an electrode region that is a diffusion layer region formed in a surface of the semiconductor substrate at the photoreceptor part, and that gathers signal charges generated by light incident on the photoreceptor part;
   a wiring structure layer that is layered over the semiconductor substrate, and that includes an interlayer insulation film;
   an open portion of the wiring structure layer, formed in a position of the photoreceptor part; and
   a partition wall composed of a metal material that is formed within the wiring structure layer adjacent to the open portion, along a boundary of the photoreceptor portion with the circuit portion, wherein
   the electrode region has an extended portion that extends farther to an outside than the boundary,
   the wiring structure layer has a first wiring which is separate from the partition wall and via which the signal charges are read from the electrode region to the circuit portion, and
   the first wiring is electrically connected with the electrode region at the extended portion.

2. The semiconductor device according to claim 1, wherein the partition wall is formed so as to surround the open portion.

3. The semiconductor device according to claim 1, further comprising:
   a second wiring formed in the wiring structure layer;
   a trench portion formed in a band shape along the boundary in the interlayer insulation film so as to pass through the interlayer insulation film;
   a plug portion composed of a metal material embedded in the trench portion; and
   a separation region that is a diffusion layer region formed along an external periphery of the photoreceptor part on a surface of the semiconductor substrate; wherein
   the partition wall is formed by a contact structure that includes the plug portion and electrically connects the second wiring with the separation region, and the separation region is set to a potential that corresponds to a power supply that is connected to the second wiring.

4. The semiconductor device according to claim 3, wherein the wiring structure layer is a multilayer wiring structure that includes a plurality of layers of the interlayer insulation film;
   the contact structure is formed by superposing the plug portions each of which is formed in the interlayer insulation films; and
   at least some of the levels among a plurality of levels of the plug portions are formed continuously with an entire periphery of the open portion.

* * * * *